United States Patent
Armitage (10) Patent No.: US 8,263,990 B2
(45) Date of Patent: Sep. 11, 2012

(54) COMPOUND SEMICONDUCTOR LIGHT-EMITTING ELEMENT AND ILLUMINATION DEVICE USING THE SAME, AND METHOD FOR MANUFACTURING COMPOUND SEMICONDUCTOR LIGHT-EMITTING ELEMENT

(75) Inventor: Robert David Armitage, Goleta, CA (US)

(73) Assignee: Panasonic Corporation, Osaka (JP)

( * ) Notice: Subject to any disclaimer, the term of this patent is extended or adjusted under 35 U.S.C. 154(b) by 235 days.

(21) Appl. No.: 12/920,972

(22) PCT Filed: Mar. 13, 2009

(86) PCT No.: PCT/JP2009/054851
§ 371 (c)(1),
(2), (4) Date: Sep. 3, 2010

(87) PCT Pub. No.: WO2009/113651
PCT Pub. Date: Sep. 17, 2009

(65) Prior Publication Data
US 2011/0012168 A1      Jan. 20, 2011

(30) Foreign Application Priority Data

Mar. 14, 2008 (JP) ................................ 2008-065452
May 26, 2008 (JP) ................................ 2008-137145

(51) Int. Cl.
*H01L 29/06* (2006.01)
*H01L 29/15* (2006.01)
*H01L 21/18* (2006.01)

(52) U.S. Cl. ........... 257/97; 257/E33.008; 257/E33.033; 438/44; 977/816; 977/817; 977/932

(58) Field of Classification Search ........................ None
See application file for complete search history.

(56) References Cited

U.S. PATENT DOCUMENTS

8,003,192 B2 * 8/2011 Hong et al. ................... 428/120
2004/0252737 A1 * 12/2004 Yi et al. .......................... 372/43
(Continued)

FOREIGN PATENT DOCUMENTS
EP     1796180     6/2007
(Continued)

OTHER PUBLICATIONS

K. Kishino, A. Kikuchi, H. Sekiguchi, and S. Ishizawa, InGaN/GaN nanocolumn LEDs emitting from blue to red, Proc. SPIE 6473, 64730T (2007).*

(Continued)

*Primary Examiner* — Victor A Mandala
*Assistant Examiner* — Joseph Schoenholtz
(74) *Attorney, Agent, or Firm* — Greenblum & Bernstein, P.L.C.

(57) ABSTRACT

A compound semiconductor light-emitting element includes: a substrate; a first electrode provided on one face of the substrate; a plurality of nanoscale columnar crystalline structures in which an n-type semiconductor layer, a light-emitting layer and a p-type semiconductor layer are stacked in order on the other face of the substrate; a second electrode connected to top portions of the plurality of columnar crystalline structures; and a foundation layer, provided on the side of the other face, in a first region being a partial region of the substrate; wherein a level difference is provided, on the other face, between the first region and a second region being at least part of a remaining region of the substrate excluding the first region.

16 Claims, 9 Drawing Sheets

U.S. PATENT DOCUMENTS

| | | | |
|---|---|---|---|
| 2005/0179052 A1* | 8/2005 | Yi et al. | 257/183 |
| 2006/0134392 A1* | 6/2006 | Hantschel et al. | 428/210 |
| 2006/0223211 A1* | 10/2006 | Mishra et al. | 438/41 |
| 2007/0045660 A1* | 3/2007 | Yi et al. | 257/183 |
| 2007/0248132 A1* | 10/2007 | Kikuchi et al. | 372/44.01 |
| 2008/0157057 A1* | 7/2008 | Kim | 257/13 |
| 2008/0191191 A1* | 8/2008 | Kim | 257/13 |

FOREIGN PATENT DOCUMENTS

| | | |
|---|---|---|
| EP | 2 254 164 A1 * | 11/2010 |
| JP | 6-244457 | 9/1994 |
| JP | 2005-228936 | 8/2005 |
| JP | 2007-49063 | 2/2007 |
| JP | 2007-123398 | 5/2007 |
| JP | 2008-034483 | 2/2008 |
| WO | 2006/025407 | 3/2006 |

OTHER PUBLICATIONS

F. Qian, S. Gradečak, Y. Li, C. -Y. Wen, and C. M. Lieber, Core/Multishell Nanowire Heterostructures as Multicolor, High-Efficiency Light-Emitting Diodes, Nano Lett. 5, 2287 (2005).*

T. Kuykendall, P. Ulrich, S. Aloni, and P. Yang, Complete composition tunability of InGaN nanowires using a combinatorial approach, Nature Mater. 6, 951 (2007).*

Hon-Way Lin et. al. , "InGaN/GaN Nanorod Array White Light-emitting Diode." Appl. Phys. Lett. 97, 073101 (2010).*

Lu, D., D. I. Florescu, D. S. Lee, J. C. Ramer, A. Parekh, V. Merai, S. Li, J. J. Gardner, M. J. Begarney, and E. A. Armour. "Advanced Characterization Techniques of Nonuniform Indium Distribution within InGaN/GaN Heterostructures Grown by MOCVD." Physica Status Solidi (a) 202.5 (2005): 795-98.*

Moon, Y. "Growth of Self-assembled Nanosize InGaN/GaN Multiple Quantum Wells Embedded in Amorphous SiNx by Metalorganic Vapor Phase Epitaxy." Journal of Crystal Growth 248 (2003): 494-97.*

Tu, L. W., C. L. Hsiao, T. W. Chi, I. Lo, and K. Y. Hsieh. "Self-assembled Vertical GaN Nanorods Grown by Molecular-beam Epitaxy." Applied Physics Letters 82.10 (2003): 1601.*

* cited by examiner

COMPOUND SEMICONDUCTOR LIGHT-EMITTING ELEMENT AND ILLUMINATION DEVICE USING THE SAME, AND METHOD FOR MANUFACTURING COMPOUND SEMICONDUCTOR LIGHT-EMITTING ELEMENT

TECHNICAL FIELD

The present invention relates to a compound semiconductor light-emitting element in which light emission takes place through recombination of positive holes and electrons in the compound semiconductor; to an illumination device using the compound semiconductor light-emitting element; and to a method for manufacturing a compound semiconductor light-emitting element. In particular, the present invention relates to a compound semiconductor light-emitting element having a plurality of columnar crystalline structures called nanocolumns or nanorods.

BACKGROUND ART

Recent years have witnessed impressive developments in light-emitting elements in which a light-emitting layer is formed using a nitride semiconductor (hereafter, nitride), and wherein light emission takes place through recombination of positive holes and electrons in the light-emitting layer when current is injected from outside. Some of the light emitted by the light-emitting element excites a phosphor. The light generated by the phosphor and the light from the light-emitting element are mixed to yield white light that is used as a light source. The use of such light sources in illumination devices has received much attention. However, no light sources that meet high-efficiency requirements have been achieved thus far. In particular, two main factors bring efficiency down in the process whereby white light is generated using a phosphor.

Firstly, part of the energy is lost (Stokes' loss) upon wavelength conversion. Specifically, some excitation light emitted by the light-emitting element and absorbed by the phosphor is converted to light, which is outputted to the exterior, and that has a wavelength of lower energy than the energy of the light emitted by the light-emitting element. This loss and efficiency drop occur in proportion to the difference between the energies of the excitation light from the light-emitting element and the light emitted by the phosphor.

Secondly, efficiency drops also on account of non-emissive recombination in the phosphor (drop in internal quantum efficiency in the phosphor). Specifically, crystal defects in the phosphor function as non-emissive recombination centers. Thus, some of the carriers generated in the phosphor by the excitation light do not contribute to emission but remain trapped in the crystal defects, lowering as a result the emission efficiency of the phosphor.

Obtaining white light using a phosphor through the above-described two stages entails a significant drop in efficiency that precludes achieving high-efficiency light-emitting elements. The above explanation is set out in cited Patent document 1, which was proposed earlier by the present applicant. In addition, the use of the above-mentioned phosphors is accompanied, in sulfide-, silicate- and halosilicate phosphors, by hydrolysis (hydration reactions) caused by moisture, and by fast deterioration on account of excitation light, for instance UV light. Such phosphors are therefore problematic in terms of low reliability and short life. Other problems when using phosphors are poor color rendering and poor hue. Specifically, realizing white light emission with high color rendering involves at present a tradeoff between color rendering and luminous efficiency, given the weak emission from red phosphors. At the same time, no high-efficiency phosphors have yet been achieved in UV-light-emitting semiconductors through excitation of RGB three-color phosphors.

In the current state of the art, therefore, there is no alternative to using RGB three-color chips to realize highly reliable white LEDs that boast high color rendering. The difficulties involved in designing optical systems that are free of color variation, and the difficulties involved, in terms of cost, in applying the above technologies to ordinary illumination, constitute added problems.

To tackle the above technical problems, the present applicant proposes a compound semiconductor light-emitting element that enables multicolor emission, such as white emission, in one chip, using the above-described columnar crystalline structures, but no phosphor. Specifically, crystal growth nuclei are grown at a temperature lower than the ordinary growth temperature of the columnar crystalline structures and then the temperature is raised over time up to the ordinary growth temperature, to confer thereby variability to the nuclei. Thereafter, the columnar crystalline structures are grown as usual, to impart thereby variability to the thickness and/or composition of the light-emitting layer, and cause the columnar crystalline structures to emit at different wavelengths. The growth of the above columnar crystalline structures is described in, for instance, Patent document 2.

The procedure set forth in Patent document 1 is excellent in terms of realizing a solid-state light source that enables multicolor emission in a simple manner, and hence at low cost, since it relies on a single substrate and a single growth step. Since multicolor emission is made possible by uneven growth, however, the above technique is problematic in terms of low precision upon coordination of the emission colors of solid-state sources into a desired hue when the technique is used, for instance, in illumination applications.

Patent document 1: JP 2007-123398 A
Patent document 2: JP 2005-228936 A

DISCLOSURE OF THE INVENTION

It is an object of the present invention to provide a compound semiconductor light-emitting element that allows realizing a desired hue at low cost, and that allows enhancing hue adjustment precision in a simple manner; to provide an illumination device using the compound semiconductor light-emitting element; and to provide a method for manufacturing the compound semiconductor light-emitting element.

Specifically, a compound semiconductor light-emitting element according to one aspect of the present invention includes: a substrate; a first electrode provided on one face of the substrate; a plurality of nanoscale columnar crystalline structures in which an n-type semiconductor layer, a light-emitting layer and a p-type semiconductor layer are stacked in order on the other face of the substrate; a second electrode connected to top portions of the plurality of columnar crystalline structures; and a foundation layer, provided on the side of the other face, in a first region being a partial region of the substrate, and for controlling the growth of the columnar crystalline structures; wherein a level difference is provided, on the other face, between the first region and a second region being at least part of a remaining region of the substrate excluding the first region.

In the above configuration, a plurality of nanoscale columnar crystalline structures called nanocolumns or nanorods are formed through stacking, in order, of an n-type semiconductor layer, a light-emitting layer and a p-type semiconductor layer, on a substrate on one face whereof a first electrode is formed, the substrate being, for instance, a conductive substrate or an insulating substrate having a conductive buffer layer provided thereon; and a second electrode is connected to top portions of the columnar crystalline structures. A foundation layer is further provided in the first region, in order to control the growth of the columnar crystalline structures. The above configuration allows modifying as a result the growth rate of the columnar crystalline structures in the first region and the second region.

The level difference between the first region and the second region can be absorbed, whereby the columnar crystalline structures can be grown to substantially the same height, through modification of the growth rate of the columnar crystalline structures in the first region and the second region, by means of the foundation layer. The lengths of the columnar crystalline structures formed in the first region and of the columnar crystalline structures formed in the second region are dissimilar, as is the ratio between length and thickness (diameter) columnar crystalline structures, in proportion to the above level difference. The wavelengths of the emitted light are accordingly dissimilar. That is, there can be formed at least two or more types of columnar crystalline structures having dissimilar aspect ratios and dissimilar wavelengths of maximum intensity in the spectrum of the emitted light.

Multicolor emission is thus made possible without using a phosphor or a plurality of chips, and thus a desired hue can be realized at low cost. Greater reliability and longer life can be easily achieved by not using a phosphor. The columnar crystalline structures in respective regions can be set to desired lengths, corresponding to a plurality of colors, by setting the level difference between the first region and the second region, and by setting the conditions of the foundation layer, without relying on growth variation. This allows enhancing hue adjustment precision in an easy way. Further, hue can be modified by modifying the surface area ratio between the first region and the second region. This makes for a greater degree of freedom in hue adjustment, and so hue can be adjusted easily according to the needs of the user.

An illumination device according to an aspect of the present invention uses the above-described compound semiconductor light-emitting element.

An illumination device is obtained thereby that realizes a desired hue, such as white light, with high precision, even when using a single type of compound semiconductor light-emitting element.

Also, a method for manufacturing a compound semiconductor light-emitting element according to one aspect of the present invention includes the steps of: forming a first electrode on one face of a substrate; forming a recess in the substrate, on the side of the other face, in a first region being a partial region of the substrate, to form thereby a level difference between the first region and a second region being at least part of a remaining region of the substrate excluding the first region; forming a foundation layer, for controlling the growth of columnar crystalline structures, on the bottom of the recess; growing, on the bottom of the recess and in the second region on the other face, a plurality of nanoscale columnar crystalline structures by stacking, in order, an n-type semiconductor layer, a light-emitting layer and a p-type semiconductor layer, up to substantially a same height over the bottom of the recess and over the other face in the second region; and forming a second electrode connected to top portions of the plurality of columnar crystalline structures.

The above method allows forming the above-described compound semiconductor light-emitting element in an easy manner. The method allows achieving a solid-state light source that realizes a desired hue at low cost, since the method relies on a single substrate and a single growth step.

BEST MODE FOR CARRYING OUT THE INVENTION

Embodiment 1

Figure 1:
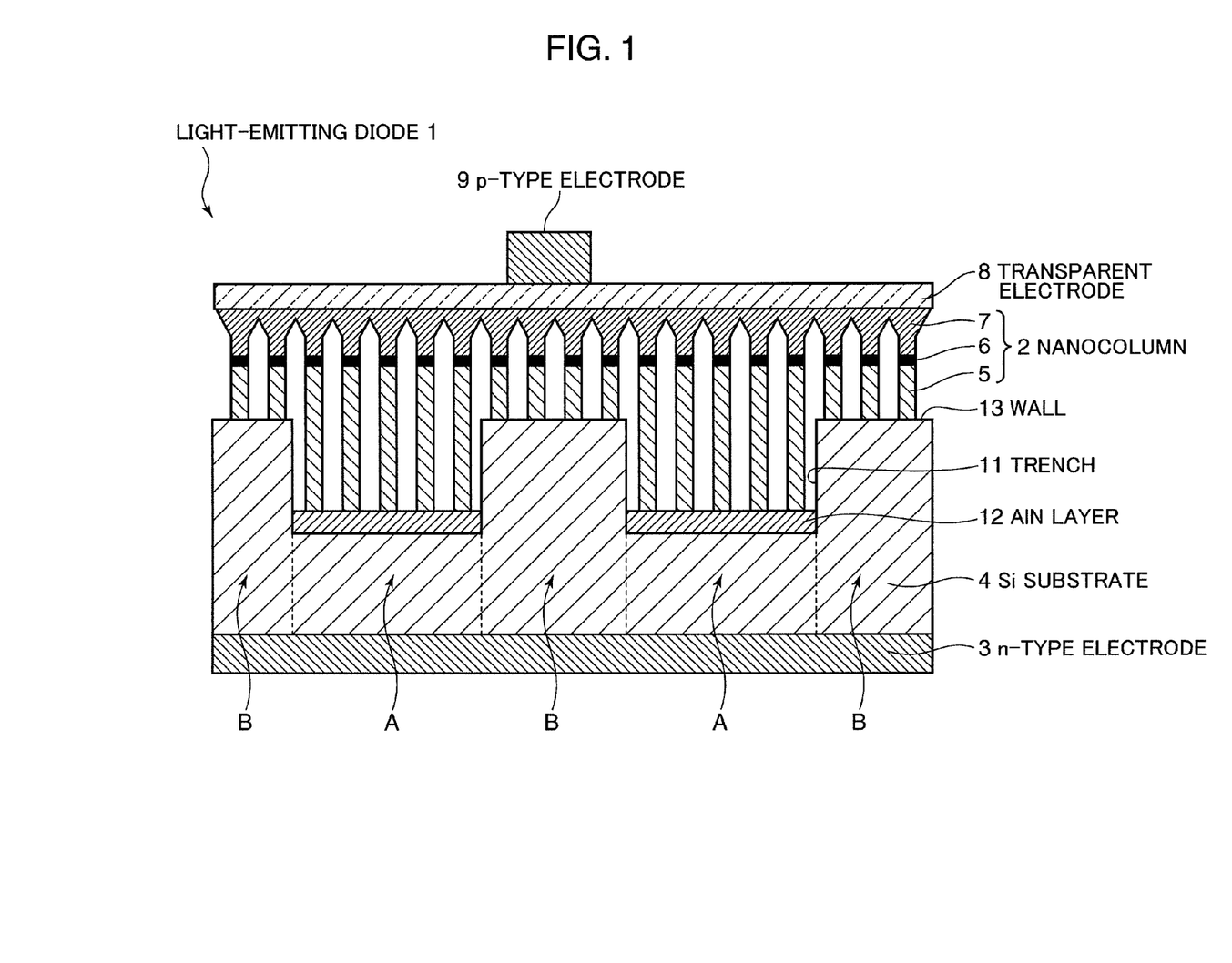
FIG. 1 is a cross-sectional diagram illustrating schematically the structure of a light-emitting element diode being a compound semiconductor light-emitting element according to a first embodiment of the present invention.

FIG. 1 is a cross-sectional diagram illustrating schematically the structure of a light-emitting element diode 1 which is a compound semiconductor light-emitting element according to a first embodiment of the present invention. The present embodiment illustrates GaN as a material of nanocolumns 2, but the embodiment is not limited thereto, and the material may be any other compound semiconductor in the broad sense, for instance oxides, nitrides, oxynitrides and the like. The nanocolumns 2 are assumed to be grown herein using a molecular beam epitaxy (MBE) apparatus, but, as is known, the nanocolumns 2 can also be formed using a metalorganic chemical vapor deposition (MOCVD) apparatus, a hybrid vapor-phase epitaxy (HVPE) apparatus or the like. An MBE apparatus is used in the embodiments below unless otherwise stated.

The light-emitting diode 1 comprises a Si substrate 4; an n-type electrode 3 (first electrode) formed on one surface of the Si substrate 4 (on the bottom face of the Si substrate 4 in FIG. 1); and a plurality of nanocolumns 2 formed on the other face of the Si substrate 4 (top face of the Si substrate 4 in FIG. 1), in such a manner that the nanocolumns 2 extend in the vertical direction. The nanocolumns 2, which are columnar crystalline structures of nanoscale size, are formed through sequential stacking of an n-type semiconductor layer 5, a light-emitting layer 6 and a p-type semiconductor layer 7, from the side of the Si substrate 4. The top portions of the group of nanocolumns 2 (p-type semiconductor layer 7) are covered by a transparent electrode 8. A p-type electrode 9 (second electrode) is further formed on the surface of the transparent electrode 8, to make up thereby the light-emitting diode 1 in the form of a GaN nanocolumn LED. Note that, in the present embodiment, recesses in the form of trenches 11 are formed at a region over part of the Si substrate 4, and an AlN layer 12, as a foundation layer for controlling (promoting) the growth of the nanocolumns 2, is formed in the trenches 11.

Figure 2A:
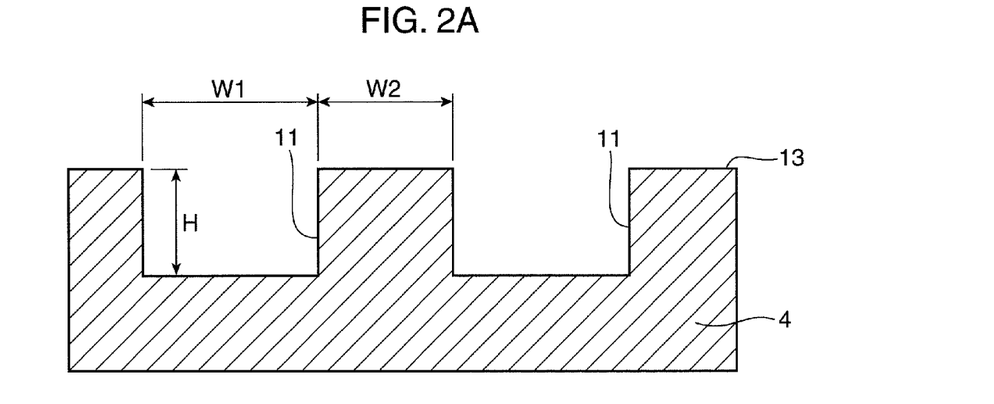
FIG. 2A, FIG. 2B and FIG. 2C are diagrams for explaining a specific manufacturing process of the light-emitting diode illustrated in FIG. 1.

FIG. 2 is a diagram for explaining a specific manufacturing process of a light-emitting diode 1 such as the one described above. Firstly, a plurality of trenches 11 are formed on an n-type Si substrate 4 having an orientation plane (111), using an RIE (reactive ion etching) apparatus, as illustrated in FIG. 2A. The trenches 11 are shaped as strips (grooves) having for instance a width W1=20 μm, and a thickness of the wall 13, i.e. an inter-trench distance W2=40 μm and a depth H=300 nm. This scale is not reflected in the relationships on paper in FIG. 1, FIG. 2 and other figures.

Figure 2B:
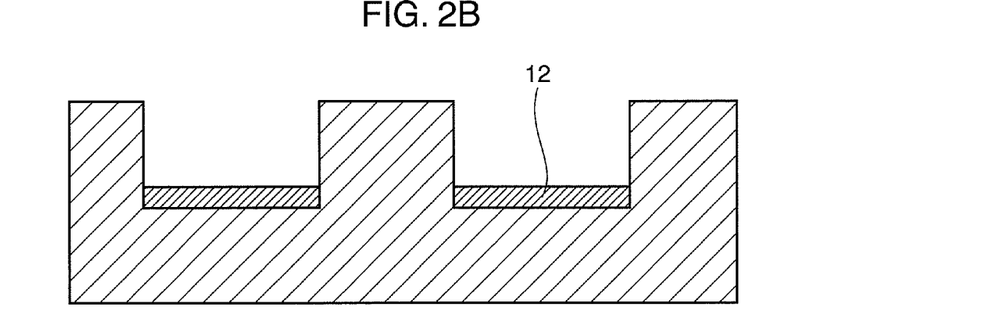

A pattern is formed, using a photoresist, on the surface of the Si substrate 4 on which the trenches 11 are formed, and then the photoresist in the trenches 11 is removed. Then 10 nm of Al are vapor-deposited over the entire surface using an EB (electron beam) vapor deposition apparatus, followed by photolithography and etching using an RIE apparatus, to remove the Al outside the trenches 11, as illustrated in FIG. 2B. Thereafter, nitridation is carried out at about 800° C. in an MBE apparatus, to turn the Al into the AlN layer 12. Alternatively, the Si substrate 4 is placed in the MBE apparatus, and the Si substrate 4 is irradiated with N radicals and Al atoms from a $N_2$ plasma source and an Al molecular beam, at a temperature of 400° C., to form thereby a 10 nm-thick AlN thin film over the entire surface of the Si substrate 4. The AlN layer 12 can then be formed by taking thereafter the Si substrate 4, having the AlN thin film formed thereon, out of the MBE apparatus, and leaving the AlN thin film in the trenches 11 to stand.

Figure 2C:
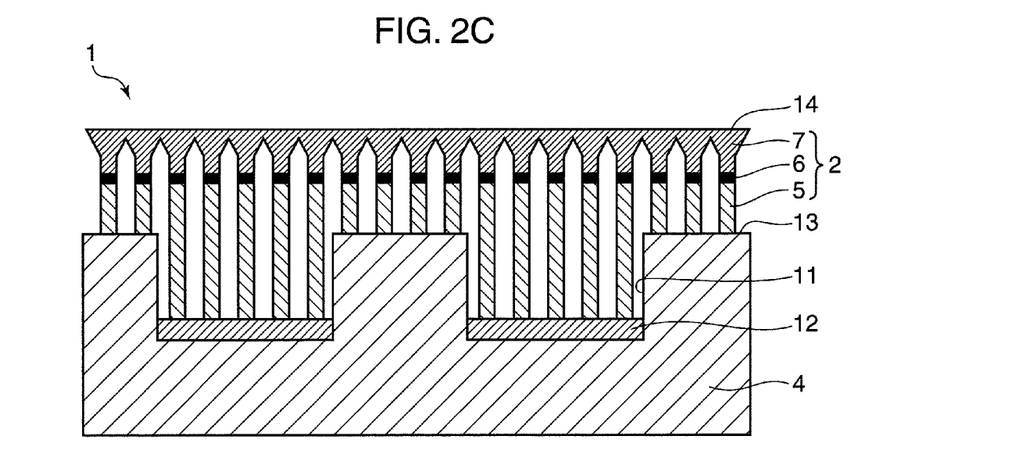

Thereafter, as illustrated in FIG. 2C, the nanocolumns 2 are grown, using the MBE apparatus, on the surface of the Si substrate 4 on which the trenches 11 are formed, namely the surface of the AlN thin film in the trenches 11, and on the surface of the wall 13, in such a manner that the nanocolumns 2 extend in a direction perpendicular to the substrate. Specifically, there is supplied hydrogen gas ($H_2$) as a carrier gas, trimethyl gallium (Ga($CH_3$)$_3$) as a Ga starting material, and ammonia ($NH_3$), as a nitrogen starting material, at a degree of vacuum of $2e^{-5}$ Torr, a substrate temperature of 750° C., and a plasma output of 450 W. Further, silane ($SiH_4$) is fed in order to add an impurity in the form of Si having n-type conductivity. The Ga flux is supplied at a flow rate of 3.4 nm/min, such that the n-type semiconductor layer 5 grows in the form of columns, for 1 hour, on the AlN layer 11, at a rate twice or faster than on the wall 13. As a result, the height of the n-type semiconductor layer 5 formed on the wall 13 and the height of the n-type semiconductor layer 5 formed on the AlN layer 11 are substantially the same.

Next, the substrate temperature is lowered to 650° C., and the impurity gas is changed from the silane ($SiH_4$) to trimethyl indium (In($CH_3$)$_3$), as an In starting material. The flow rate of the In flux is set to 10 nm/min, to grow thereby the light-emitting layer 6 comprising InGaN quantum wells on the n-type semiconductor layer 5. The growth time is 1 minute. The flow rate and the plasma output of the Ga flux is the same as during growth of the n-type semiconductor layer 5. It is important that the In flux rate should be significantly greater than the rate of Ga flux, and that the Ga flux rate should be smaller than the N flux rate. The light-emitting layer 6 may also be formed as an InGaN/GaN multilayer quantum well structure. A reflective film may also be optionally formed in the n-type semiconductor layer 5.

The substrate temperature is raised then to 750° C., and the impurity gas is changed from trimethyl indium (In($CH_3$)$_3$) to cyclopentadienyl magnesium (Mg($C_5H_5$)$_2$) that contains Mg having p-type conductivity. The flow rate of the Mg flux is set to 1 nm/min, and the flow rate of the Ga flux to 5 nm/min, to grow thereby the p-type semiconductor layer 7 on the light-emitting layer 6. The growth time is 4 minutes, and the plasma output is the same as the above 450 W, throughout the growth of the nanocolumns 2. During growth of the p-type semiconductor layer 7, the flow rate of ammonia ($NH_3$), the flow rate of the carrier gas $H_2$ or the growth temperature are gradually modified, to widen gradually thereby the diameter of the nanocolumns 2, to merge as a result the p-type semiconductor layer 7 of each nanocolumn 2 and form a planar p-type layer 14.

Thereafter, a Ni 3 nm/ITO 100 nm stacked p-type contact layer resulting from stacking Ni to a thickness of 3 nm and ITO to a thickness of 100 nm, is formed, as the transparent electrode 8, on the surface of the p-type layer 14, as illustrated in FIG. 1, by vapor deposition in an EB vapor deposition apparatus. On the transparent electrode 8 there is formed a p-type pad electrode comprising 500 nm of Au, as the p-type electrode 9. Similarly, the n-type electrode 3, comprising an n-type pad electrode and a Ti 30 nm/Au 500 nm stacked n-type contact layer resulting from stacking Ti to a thickness of 30 nm and Au to a thickness of 500 nm, is formed, by vapor deposition in the EB vapor deposition apparatus, on the rear face of the Si substrate 4, to complete thereby the light-emitting diode 1.

Thus, trenches 11 are formed in a partial region of the Si substrate 4, the AlN layer 12, as a compound seed crystal film of the nanocolumns 2, is further formed in the trenches 11, and the nanocolumns 2 are grown thereafter. As a result, the rate of growth of the nanocolumns 2 is faster (for instance, about twice as fast) in the regions having the AlN layer 12 than in the regions on the wall 13 that lack the AlN layer 12. After a predetermined lapse of growth time, the level difference between the trenches 11 and the wall 13 is absorbed and the surface of the p-type layer 14 stands at substantially an identical height. As a result there can be formed at least two or more types of nanocolumns 2 having dissimilar height, i.e. dissimilar aspect ratio (length/diameter) and having dissimilar wavelengths of maximum intensity in the spectrum of the emitted light.

In this case, as illustrated in FIG. 1, the region sandwiched between the bottom face of the trenches 11 and the bottom face of the Si substrate 4 corresponds to a first regions A, and the remaining region resulting from excluding the first regions A from the Si substrate 4, namely the region sandwiched between the top face of the wall 13 and the bottom face of the Si substrate 4, corresponds to the second region B.

Figure 3:
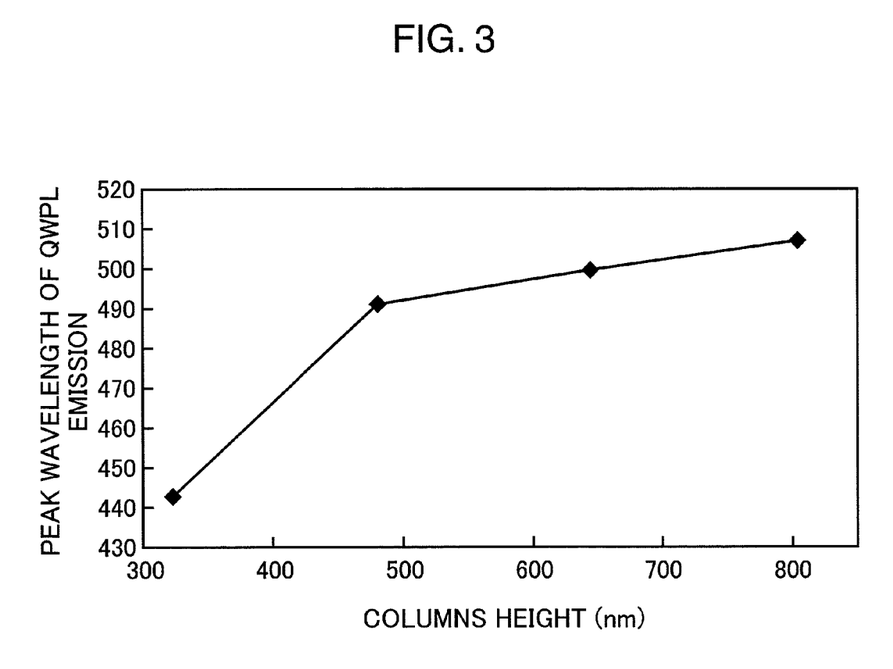
FIG. 3 is a graph that plots the difference in peak wavelength for different nanocolumn heights, for illustrating results of an experiment by the inventors of the present application.

FIG. 3 illustrates results of an experiment carried out by the inventors. FIG. 3 is a graph illustrating the relationship between peak wavelength and the height (length) of nanocolumns 2 upon growth of nanocolumns 2 having a diameter of 300 nm and comprising the above-described composition. It is found that the peak wavelength lengthens as the height of the nanocolumns 2 increases, i.e. as the aspect ratio increases. The reason for the longer peak wavelength associated with a larger aspect ratio is as follows. Firstly, the supply of atoms in the growth mechanism of the GaN nanocolumns is determined by sorption-desorption processes and surface diffusion processes.

The nanocolumn growth mechanism is described below in a rough approximation. Surface diffusion processes are thought to predominate in Ga atoms under the conditions of nanocolumn growth. Specifically, Ga atoms leave the base of the nanocolumns, and diffuse towards the leading end thereof, with a constant probability. This probability can be assumed to be proportional to the diffusion time. By contrast, In atoms are governed by sorption-desorption processes, which accompany ordinary crystal growth, to/from the quantum well layer. Therefore, the number of Ga atoms that reach the quantum well layer decreases as the height of the nanocolumns increases, while In atoms are taken up in the quantum well layer at a constant proportion, regardless of the height of the nanocolumns. As a result, the In/Ga ratio in the quantum well layer increases in proportion to the height (length) of the nanocolumns, and thus the emission wavelength shifts to longer wavelengths as the nanocolumns become higher, as described above.

When the diameters of the nanocolumns are different, for a same nanocolumn height, the number of In atoms taken up in the quantum well layer varies in proportion to the square of the diameter of the nanocolumns. By contrast, the number of Ga atoms varies in proportion to the diameter of the nanocolumns. Accordingly, the In/Ga ratio increases proportionally to the diameter. The In/Ga ratio that determines the wavelength depends therefore on the aspect ratio (height/diameter) of the nanocolumns, to the effect that a greater aspect ratio implies longer wavelengths.

The above mechanism can be exploited to allow forming an LED chip having dissimilar wavelengths from regions having the AlN layer 12 and from the wall 13 that lacks the AlN layer 12, on one chip that is grown under identical conditions. White light can be created by setting the length of the nanocolumns 2 in such a manner that there is emitted short-wavelength light and long-wavelength light along a straight line that intersects a white region in the CIE (Commission International de l'Eclairage) chromaticity diagram. White light can be generated more faithfully by setting three of the above-described level differences and setting the lengths of the latter in such a manner that the wavelengths of maximum intensity in the spectrum of light emitted by the nanocolumns 2 at respective regions are emission wavelengths at the vertices of a triangle that encloses a white region in the CIE chromaticity diagram.

It becomes thus possible to implement a solid-state light source that realizes a desired hue, such as white light or the like, using a same Si substrate 4 and a single growth step, and doing so therefore at low cost. The desired hue can be realized using no phosphor, and hence both high reliability and long life can be achieved. Also, the surface area of the AlN layer 12 and the trenches 11 can be adjusted arbitrarily. The hue can therefore be fine-tuned, with high precision, in accordance with the needs of the user.

Embodiment 2

Figure 4:
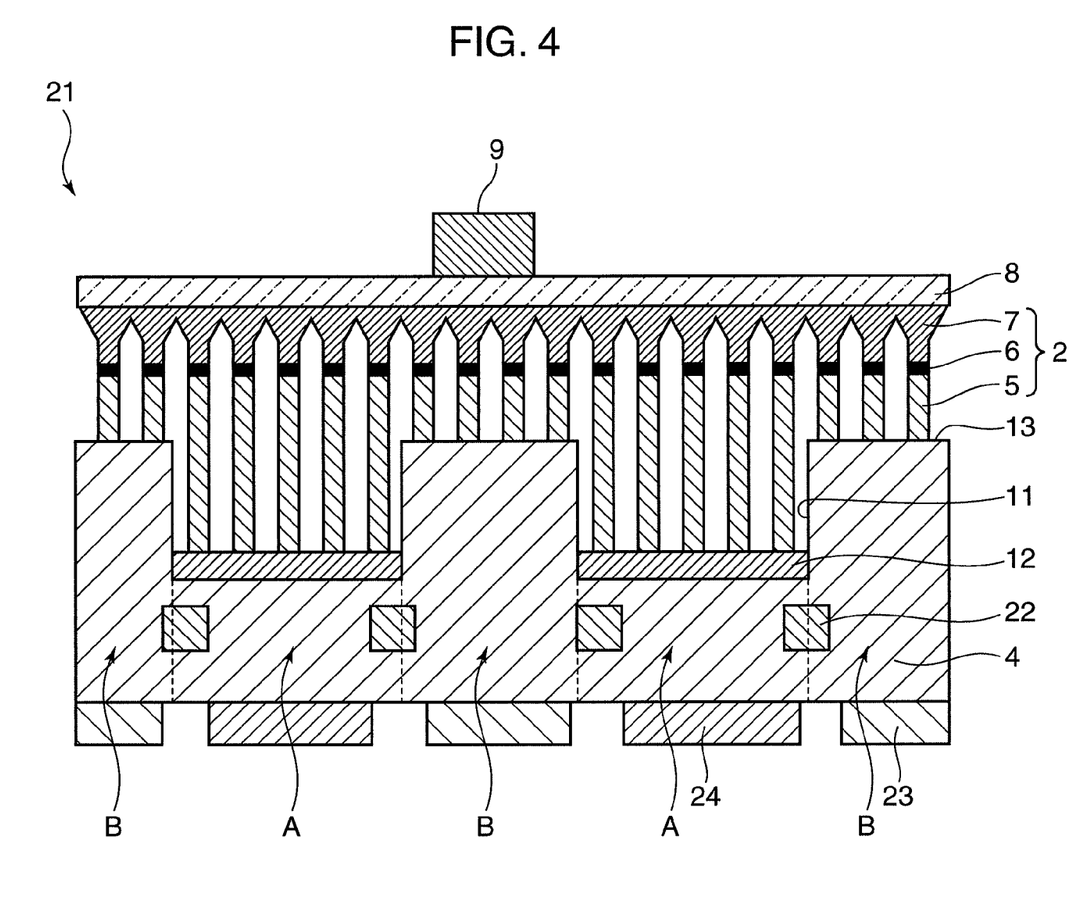
FIG. 4 is a cross-sectional diagram illustrating schematically the structure of a light-emitting element diode being a compound semiconductor light-emitting element according to a second embodiment of the present invention.
Figure 5:
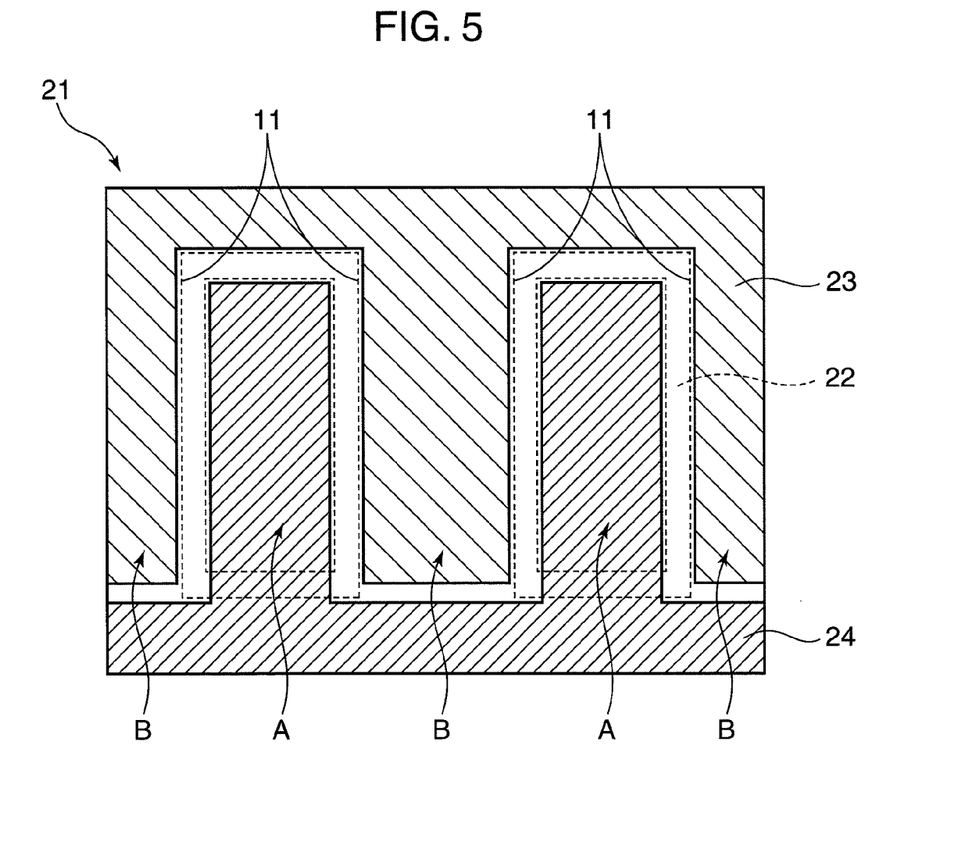
FIG. 5 is a bottom-face diagram of the light-emitting diode illustrated in FIG. 4.

FIG. 4 is a cross-sectional diagram illustrating schematically the structure of a light-emitting element diode 21 which is a compound semiconductor light-emitting element according to a second embodiment of the present invention. FIG. 5 is a bottom-face diagram of the light-emitting diode 21. The light-emitting diode 21 is similar to the above-described light-emitting diode 1. Thus, corresponding portions will be denoted with the same reference numerals, and an explanation thereof will be omitted. Features to be noted are as follows. In the present embodiment, specifically, there are provided insulating regions 22 at the lower portion of the bottom of the trenches 11 in the outer periphery thereof, i.e. at the boundaries between the first regions A and the second regions B. Also, the trenches 11 are formed extending continuously in the form of a strip (towards the far end in FIG. 4). As illustrated in FIG. 5, there is formed a comb shaped n-type electrode 24 (first region electrode) that connects respective regions (respective first regions A) of the trenches 11 continuously, and a comb-type n-type electrode 23 (second region electrode) that connects regions of respective wall 13 (respective second regions B), in such a manner that voltage and current are applied individually to the n-type electrodes 23, 24.

That is, voltage and current for triggering emission of the long nanocolumns 2 formed in the trenches 11 can be supplied en bloc by the n-type electrode 24 and also voltage and current for triggering emission of the short nanocolumns 2 formed on the wall 13 can be supplied en bloc by the n-type electrode 24. The emission color (hue) of the light-emitting diode 21 as a whole can be regulated by regulating individually the intensity of light emitted by the long nanocolumns 2 and the intensity of light emitted by the short nanocolumns 2.

Figure 6A:
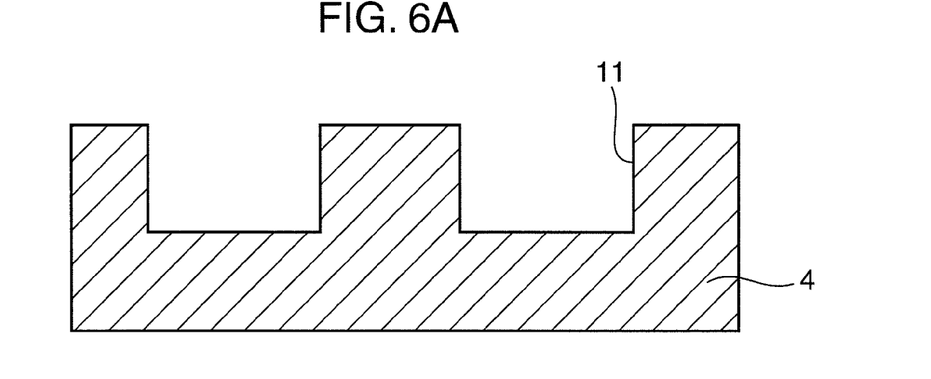
FIG. 6A, FIG. 6B and FIG. 6C are diagrams for explaining a specific manufacturing process of the light-emitting diode illustrated in FIG. 4 and FIG. 5.
Figure 6B:
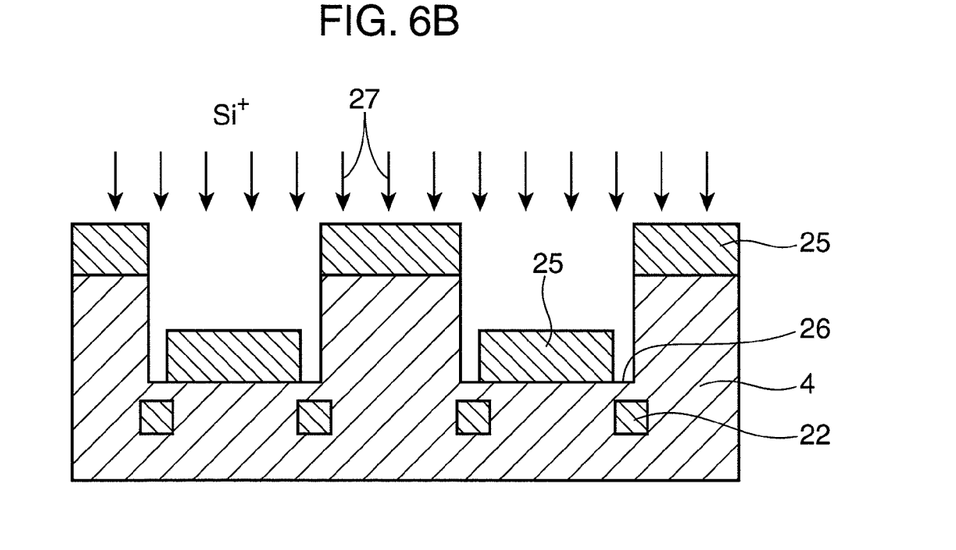

FIG. 6 is a diagram for explaining a specific manufacturing process of a light-emitting diode 21 such as the one described above. A plurality of trenches 11 are formed as illustrated in FIG. 6A in the same way as in FIG. 2A. A 100 nm-thick Si oxide film 25 is formed using the CVD apparatus on the Si substrate 4 as illustrated in FIG. 6B. Then openings 26 are formed at the outer periphery of the bottom of the trenches 11 through ordinary photolithography and etching by RIE or HF (hydrogen fluoride). Next, the insulating regions 22 comprising $SiO_2$ can be formed by implanting O ions, as indicated by the reference numeral 27, in an ion implantation apparatus, using the Si oxide film 25 as a mask, followed by annealing.

Figure 6C:
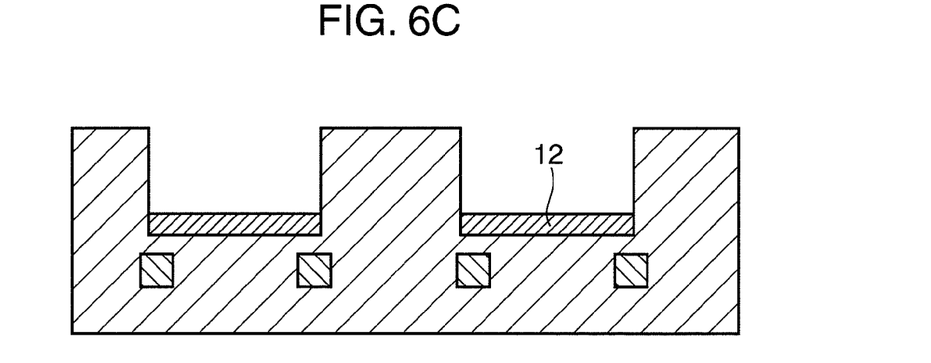

As illustrated in FIG. 6C, The AlN layer 12 is then formed in the trenches 11, and nanocolumns 2 are grown, after which there are formed the transparent electrode 8 and the p-type electrode 9, as well as the n-type electrodes 23, 24, to complete the light-emitting diode 21. In the light-emitting diode 1 illustrated in FIG. 1, the n-type electrode 3 comprising an n-type pad electrode and a Ti 30 nm/Au 500 nm stacked n-type contact layer is formed on the entire bottom face of the Si substrate 4. In the present embodiment, by contrast, the regions (first regions A) of the trenches 11 and the regions (second regions B) of the wall 13 are separated in the light-emitting diode 21 by the insulating regions 22, as illustrated in FIG. 5.

Also, the n-type electrodes 23, 24 are formed on the bottom face of the Si substrate 4. The n-type electrodes 23, 24 are both formed to a comb shape. The n-type electrodes 23, 24 are disposed opposing each other, on the bottom face of the Si substrate 4, in such a manner that respective comb prongs mesh with each other. Also, the n-type electrodes 23, 24 are formed in such a manner that the comb prongs of n-type electrode 24 are connected to the first regions A, and the comb prongs of the n-type electrode 23 are connected to the second regions B. The n-type electrodes 23, 24 spaced apart from each other can be realized in a straightforward manner by simply forming the above-described Ti/Au layer, followed by an ordinary photolithography process and an etching process.

Thus, the regions of respective trenches 11 are not disposed in a scattered or distributed layout, such as islands or the like, on the Si substrate 4. Instead, the trenches 11 are formed as strips, and there are formed, spaced apart from each other, the n-type electrode 24 that supplies voltage and current en bloc to the nanocolumns 2 formed in the trenches 11, and the n-type electrode 23 that supplies voltage and current en bloc to the nanocolumns 2 formed on the wall 13. As a result, voltage can be applied to the nanocolumns 2 formed in the trenches 11 and the nanocolumns 2 formed on the wall 13 in accordance with the respective emission wavelengths of the nanocolumns 2. The intensity of the respective spectra and the hues can be adjusted by varying the respective current that flows through the n-type electrodes 23, 24 (one-chip multicolor emission).

In this case, the transparent electrode 8 and p-type electrode 9 can be jointly used as electrodes that form pairs with the n-type electrodes 23, 24.

Formation of the insulating regions 22 at the lower portion of the outer periphery of the bottom of the trenches 11 allows suppressing leakage of current from a given region to other regions. The above-described one-chip multicolor emission can be controlled more easily thereby.

Embodiment 3

FIG. 7 is a diagram for explaining a manufacturing process of a light-emitting diode 31, which is a compound semiconductor light-emitting element according to a third embodiment of the present invention. The light-emitting diode 31 is similar to the above-described light-emitting diode 1. Thus, corresponding portions will be denoted with the same reference numerals, and a recurrent explanation thereof will be omitted. Note that in the above-described light-emitting diodes 1, 21, the AlN layer 12 that constitutes a compound seed crystal film is formed, as a foundation layer, in the trenches 11. In the light-emitting diode 31, by contrast, a compound semiconductor material such as the above-mentioned Ga, N, In, Al or the like, and an additional material such as Mg, Si or the like, are incorporated, through fusion, during the growth of the nanocolumns 2. Also, a Ni thin film 32, which is a catalyst material film that does not form compounds of itself, is formed as a foundation layer.

Figure 7A:
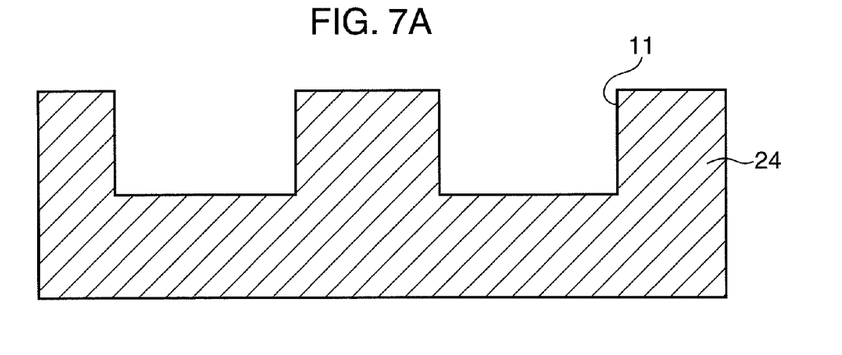
FIG. 7A, FIG. 7B and FIG. 7C are diagrams for explaining a manufacturing process of a light-emitting diode being a compound semiconductor light-emitting element according to a third embodiment of the present invention.
Figure 7B:
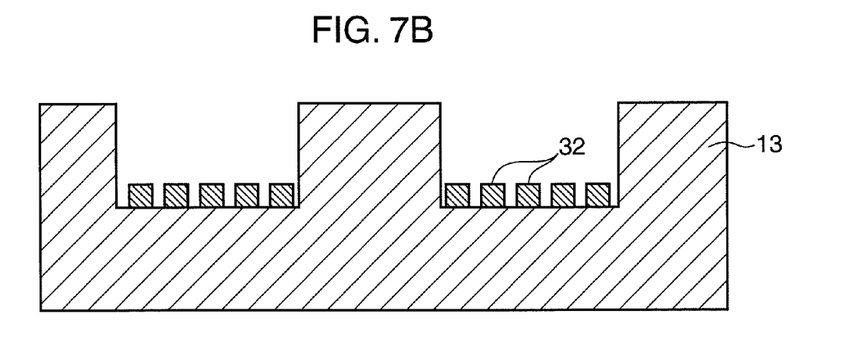

Specifically, the trenches 11 are formed on a GaN substrate 34, as illustrated in FIG. 7A, using an RIE apparatus. The trenches 11 have a width W1=20 μm, and the wall 13 a thickness, i.e. an inter-trench distance W2=40 μm, and a depth H=300 nm, as is the case above. A 5-nm thick Ni thin film 32 is vapor-deposited on the entire surface of the GaN substrate 34, in which the trenches 11 are formed, using an EB vapor deposition apparatus. Superfluous Ni thin film is then removed from outside the trenches 11 and from within the trenches 11, as illustrated in FIG. 7B, by photolithography and etching using an RIE apparatus. As a result there are left the Ni thin film 32 only at portions where the nanocolumns 2 are to be formed.

Figure 7C:
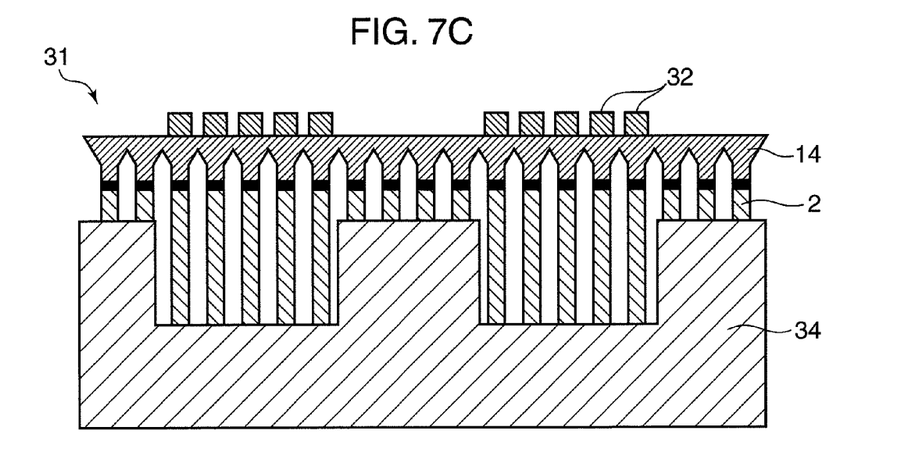

When growing the nanocolumns 2 in the MBE apparatus, using the substrate 34 as a growth substrate, the nanocolumn growth rate can be accelerated, for instance about five-fold, at the portions where the Ni thin film 32 is present, as compared with portions where the latter is absent, depending on the adsorption ratio and diffusion rate of mainly Ga, N and In atoms that form the nanocolumns to the Ni thin film 32. As illustrated in FIG. 7C, the level differences between the trenches 11 and the wall 13 are absorbed so that the surface of the p-type layer 14 can stand at substantially the same height.

The growth rate can be modified by changing the catalyst material into another material, such as Cu, Fe, Au or the like, depending on the differences in adsorption ratio and diffusion rate among respective atoms. Also, the diameter (thickness) of the nanocolumns 2, i.e. the aspect ratio thereof, can be modified for a given same height in a case where the Ni thin film 32 is patterned by electron beam lithography or nanoimprinting. The above configuration affords a highly reliable and long-life solid-state light source that can realize a desired hue at low cost.

Embodiment 4

FIG. 8 is a diagram for explaining a manufacturing process of a light-emitting diode 41, which is a compound semiconductor light-emitting element according to a fourth embodiment of the present invention. The light-emitting diode 41 is similar to the above-described light-emitting diode 31. Thus, corresponding portions will be denoted with the same reference numerals, and a recurrent explanation thereof will be omitted. Note that, in the above-described light-emitting diode 31, the Ni thin film 32, as a catalyst material film, is formed only in the trenches 11. By contrast, a Ni thin film 43 is provided also on the wall 13 of the light-emitting diode 41, such that the thickness of the Ni thin film 43 is greater than the thickness of the Ni thin film 42 within the trenches 11.

Figure 8A:
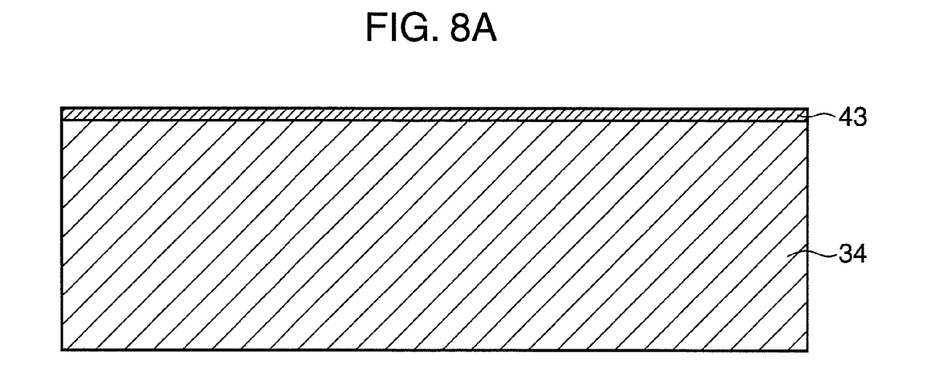
FIG. 8A, FIG. 8B and FIG. 8C are diagrams for explaining a manufacturing process of a light-emitting diode being a compound semiconductor light-emitting element according to a fourth embodiment of the present invention.
Figure 8B:
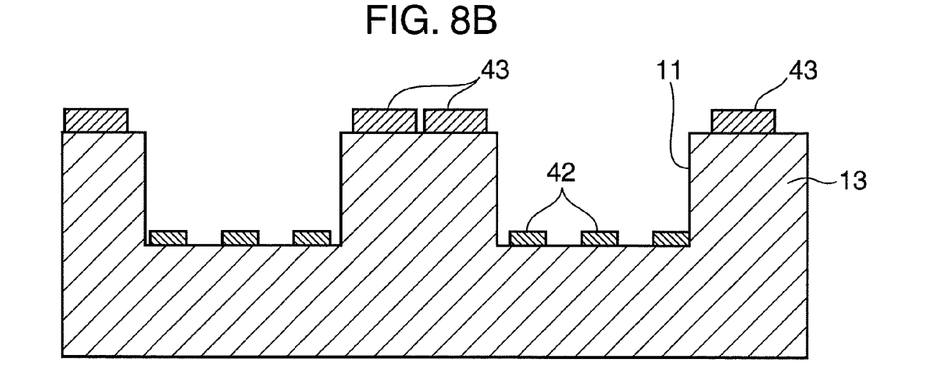

Specifically, the Ni thin film 43 is deposited to a thickness of 3 nm on the GaN substrate 34, as illustrated in FIG. 8A, using an MBE apparatus. The trenches 11 are formed thereafter by photolithography and etching using an RIE apparatus. The trenches 11 have a width W1=20 μm, and the wall 13 a thickness, i.e. an inter-trench distance W2=40 μm, and a depth H=300 nm, as is the case above. Thereafter, a Ni thin film is further vapor-deposited, to a thickness of 2 nm, over the entire surface, using an EB vapor deposition apparatus, to form thereby a 5 nm-thick Ni thin film 43 on the wall 13 and a 2 nm-thick Ni thin film 42 in the trenches 11. The entire GaN substrate 34 is then heated, whereupon the Ni thin films 42, 43 shrink and separate, forming islands, as illustrated in FIG. 8B. Large islands of the Ni thin film 43 are interspersed, at a high density, on the wall 13, while small islands of the Ni thin film 42 are scattered, at a low density, within the trenches 11.

Figure 8C:
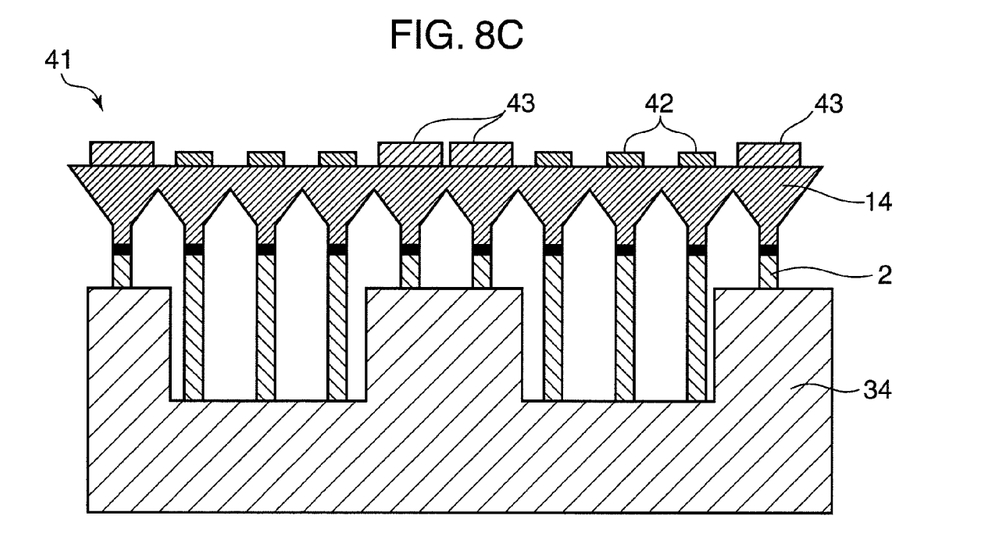

When a substrate 34 such as the one described above is used as the substrate, the same catalyst material is used both in portions of the trenches 11 and portions of the wall 13, to grow the nanocolumns 2 using the above-described MBE apparatus. Therefore, although the Ga, N and In atoms that form the nanocolumns have the same adsorption probability onto and diffusion rate into the Ni thin films 42, 43, the growth rate of the nanocolumns 2 is faster at low-density portions of the trenches 11 on account of the differences in the number of atoms supplied over a long surface-diffusion length, such as that of the nanocolumns 2, in the case where the density of catalyst islands is somewhat high. As illustrated in FIG. 8C, the level differences between the trenches 11 and the wall 13 are absorbed so that the surface of the p-type layer 14 can stand at substantially the same height. The above configuration affords a highly reliable and long-life solid-state light source that can realize a desired hue at low cost.

Needless to say, the modification of the growth rate of the nanocolumns 2 through formation of different films 42, 43 in the trenches 11 and the wall 13 under the above conditions is not limited to a catalyst material film in the form of the films 42, 43, and can be likewise used in the above-described compound seed crystal film.

Embodiment 5

Figure 9A:
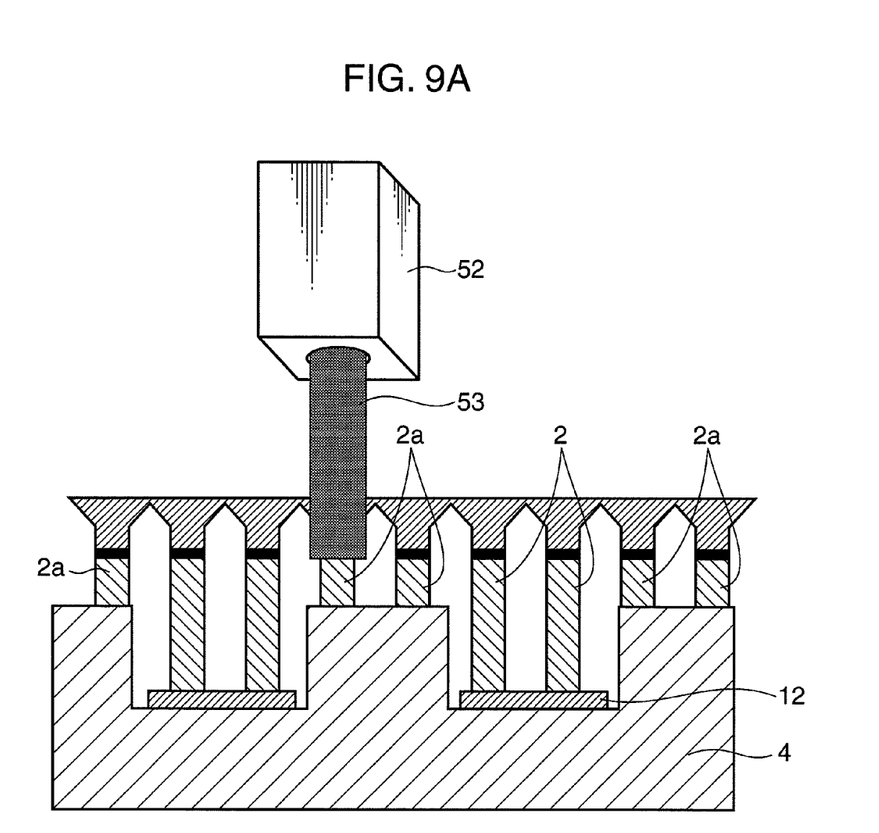
FIG. 9A and FIG. 9B are diagrams for explaining a manufacturing process of a light-emitting diode being a compound semiconductor light-emitting element according to a fifth embodiment of the present invention.

FIG. 9 is a diagram for explaining a manufacturing process of a light-emitting diode 51, which is a compound semiconductor light-emitting element according to a fifth embodiment of the present invention. The light-emitting diode 51 is similar to the above-described light-emitting diode 1. Thus, corresponding portions will be denoted with the same reference numerals, and a recurrent explanation thereof will be omitted. The feature to be noted herein is that the aspect ratio of specific nanocolumns 2a in the light-emitting diode 51 is modified in a post-treatment. In the example illustrated in FIG. 9, a laser beam 53 from a laser source 52 is irradiated onto specific nanocolumns 2a, as illustrated in FIG. 9A, in an oxygen atmosphere. As a process for modifying the aspect ratio, similar effects can be obtained in a post-treatment by inactivation or the like through oxidation or sulfuration.

Figure 9B:
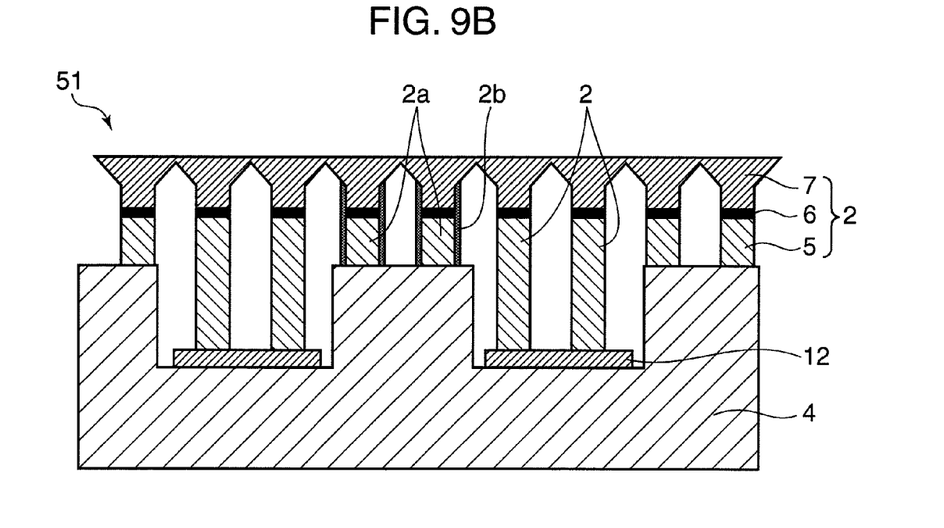

The temperature of the specific nanocolumns 2a rises locally through irradiation of the laser beam 53, whereupon of the outer periphery of the nanocolumns 2a is oxidized to form an oxide film 2b, as illustrated in FIG. 9B. The effective diameter becomes substantially thinner, and the aspect ratio increases accordingly. The laser beam 53 has a peak wavelength no greater than the bandgap of GaN. As a result, the laser beam 53 passes through the p-type layer 14 and irradiates the entirety of the specific nanocolumns 2a. The oxide film formed as a result on the p-type layer 14 can be removed by light RIE etching. The hue can thus be further adjusted as thereby. To increase the aspect ratio of all the nanocolumns 2, heating may be performed not locally but overall, in an electric oven or the like.

Using an illumination device in the form of the light-emitting diode 1, 21, 31, 41, 51 having the above features allows achieving an illumination device that can realize a desired hue, for instance, white light, with high precision, even when using a single type of the light-emitting diode 1, 21, 31, 41, 51.

A compound semiconductor light-emitting element according to one aspect of the present invention includes: a substrate; a first electrode provided on one face of the substrate; a plurality of nanoscale columnar crystalline structures in which an n-type semiconductor layer, a light-emitting layer and a p-type semiconductor layer are stacked in order on the other face of the substrate; a second electrode connected to top portions of the plurality of columnar crystalline structures; and a foundation layer, provided on the side of the other face, in a first region being a partial region of the substrate, and for controlling the growth of the columnar crystalline structures; wherein a level difference is provided, on the other face, between the first region and a second region being at least part of a remaining region of the substrate excluding the first region.

In the above configuration, a plurality of nanoscale columnar crystalline structures called nanocolumns or nanorods are formed through stacking, in order, of an n-type semiconductor layer, a light-emitting layer and a p-type semiconductor layer, on a substrate on one face whereof a first electrode is formed, the substrate being, for instance, a conductive substrate or an insulating substrate having a conductive buffer layer provided thereon; and a second electrode is connected to top portions of the columnar crystalline structures. A foundation layer is further provided in the first region, in order to control the growth of the columnar crystalline structures. The above configuration allows modifying as a result the growth rate of the columnar crystalline structures in the first region and the second region.

The level difference between the first region and the second region can be absorbed, whereby the columnar crystalline structures can be grown to substantially the same height, through modification of the growth rate of the columnar crystalline structures in the first region and the second region, by means of the foundation layer. The lengths of the columnar crystalline structures formed in the first region and of the columnar crystalline structures formed in the second region are dissimilar, as is the ratio between length and thickness (diameter) thereof, in proportion to the level difference. The wavelengths of the emitted light are accordingly dissimilar. That is, there can be formed at least two or more types of columnar crystalline structures having dissimilar aspect ratios and dissimilar wavelengths of maximum intensity in the spectrum of the emitted light.

Multicolor emission is thus made possible without using a phosphor or a plurality of chips, and thus a desired hue can be realized at low cost. Greater reliability and longer life can be easily achieved by not using a phosphor. The columnar crystalline structures in respective regions can be set to desired lengths, corresponding to a plurality of colors, by setting the level difference between the first region and the second region, and by setting the conditions of the foundation layer, without relying on growth variation. This allows enhancing hue adjustment precision in an easy way. Further, hue can be modified by modifying the surface area ratio between the first region and the second region. This makes for a greater degree of freedom in hue adjustment, and so hue can be adjusted easily according to the needs of the user.

Preferably, a foundation layer is formed on the other face in the second region and conditions different from those of the foundation layer in the first region.

In the above configuration, the conditions of the foundation layer of the first region and of the foundation layer of the second region are set individually. The difference in the growth rates of the columnar crystalline structures at the first and second regions can be fine-tuned easily thereby. The length of the columnar crystalline structures in the first and second regions can be easily adjusted as a result, i.e. the hue of the emission color can be easily fine-tuned as a result.

Preferably, the foundation layer in the first region and the foundation layer in the second region differ from each other in at least one condition from among layer thickness and material.

The growth rate of the columnar crystalline structures in the first and second regions can be made different by prescribing at least one dissimilar condition, from among layer thickness and material, for the foundation layer in the first region and the foundation layer in the second region.

The foundation layers may be formed divided into a plurality of islands, and the size of the islands that make up the foundation layer in the first region and the size of the islands that make up the foundation layer in the second region are different from each other.

In the above configuration, the thickness (diameter) of the columnar crystalline structures is modified in accordance with the size of the islands of the foundation layers. Therefore, the ratio between length and diameter of the columnar crystalline structures can be made to vary by modifying the diameter of the columnar crystalline structures in the first region and of the columnar crystalline structures in the second region. Light of a plurality of wavelengths can be emitted as a result.

Preferably, the ratio of length to thickness of the columnar crystalline structures provided in the first and second regions is set in such a manner that the wavelengths of maximum intensity in the spectrum of light emitted by the columnar crystalline structures provided in the first and second regions are wavelengths of colors positioned at both ends of a straight line that intersects a white region in the CIE chromaticity diagram.

The above configuration allows outputting substantially white light using one element.

A third region may be provided in the substrate, the third region being at least part of a remaining region of the substrate excluding the first and second regions, and having a level difference with respect to the first and second regions, in the other face of the substrate; a foundation layer for controlling the growth of the columnar crystalline structures may be formed on the other face in the third region; and wherein the ratio of length to thickness of the columnar crystalline structures provided in the first, second and third regions may be set in such a manner that the wavelengths of maximum intensity in the spectrum of light emitted by the columnar crystalline structures provided in the first, second and third regions are wavelengths of colors positioned at the vertices of a triangle that encloses a white region in the CIE chromaticity diagram.

The above configuration allows outputting light yet closer to white using one element.

Preferably, the foundation layer is a compound seed crystal film.

The above feature allows promoting the growth of the columnar crystalline structures through the use of a compound seed crystal film such as AlN or the like as a foundation layer, for a compound semiconductor material such as Ga, N, In, Al or the like or an additional material such as Mg, Si or the like.

The foundation layer may be a catalyst material film.

The above feature allows promoting the growth of the columnar crystalline structures through the use, as a foundation layer for a compound semiconductor material such as Ga, N, In, Al or the like or an additional material such as Mg, Si or the like, of a catalyst material film such as Ni, Cu, Fe, Au or the like that is taken up, through fusion, into the foregoing materials but which does not form compounds of itself.

Preferably, the first region is provided as a plurality of strips spaced apart from each other; a region that constitutes the spacings is used as the second region; and the first electrode includes: a first region electrode for supplying voltage en bloc to the plurality of first regions; and a second region electrode, spaced apart from the first region electrode, for supplying voltage to the second region.

Through the use of the first region electrode and the second region electrode, the above configuration allows supplying different voltages to the columnar crystalline structures formed in the first region and the columnar crystalline structures formed in the second region. As a result there can be applied voltage to the columnar crystalline structures of the respective regions in accordance with the emission wavelength thereof. The intensity of the respective spectra, as well as hue, can be adjusted by varying the current that flows through the respective electrodes (one-chip multicolor emission).

Preferably, the first region electrode is formed to a comb shape on the one face of the substrate, and is arrayed and connected in such a manner that the prongs of the comb in the comb shape run along the strip-like first region; and the second region electrode is formed to a comb shape on the one face of the substrate, and is connected at the second region by being disposed opposing the first region electrode in such a manner that the prongs of the combs mesh with each other.

The above configuration allows forming easily a first region electrode for supplying voltage en bloc to the plurality of first regions, and a second region electrode, spaced apart from the first region electrode, for supplying voltage to the second region.

Preferably, an insulating region is provided at the boundary between the first region and the second region.

By forming an insulating region between the first region and the second region, the above configuration allows reducing current leakage from a given region to another region. Multicolor emission by one chip can be easily controlled as a result.

An illumination device according to an aspect of the present invention uses the above-described compound semiconductor light-emitting element.

An illumination device is obtained thereby that realizes a desired hue, such as white light, with high precision, even when using a single type of compound semiconductor light-emitting element.

Also, a method for manufacturing a compound semiconductor light-emitting element according to one aspect of the present invention includes the steps of: forming a first electrode on one face of a substrate; forming a recess in the substrate, on the side of the other face, in a first region being a partial region of the substrate, to form thereby a level difference between the first region and a second region being at least part of a remaining region of the substrate excluding the first region; forming a foundation layer, for controlling the growth of columnar crystalline structures, on the bottom of the recess; growing, on the bottom of the recess and in the second region on the other face, a plurality of nanoscale columnar crystalline structures by stacking, in order, an n-type semiconductor layer, a light-emitting layer and a p-type semiconductor layer, up to substantially a same height over the bottom of the recess and over the other face in the second region; and forming a second electrode connected to top portions of the plurality of columnar crystalline structures.

The above method allows forming the above-described compound semiconductor light-emitting element in an easy manner. The method allows achieving a solid-state light source that realizes a desired hue at low cost, since the method relies on a single substrate and a single growth step.

Preferably, the method further includes the steps of: after formation of the recess, forming a mask such that the outer periphery of the bottom of the recess is open; forming an insulating layer comprising $SiO_2$ through ion implantation into the first region, through the opening portion; and removing the mask.

The above features allow forming easily an insulating region at the boundary between the first region and the second region.

Preferably, the method further includes a step of: performing a post-treatment, after growing the plurality of columnar crystalline structures, to selectively narrow the effective diameter of the columnar crystalline structures.

The above feature allows modifying the ratio of length to thickness of the columnar crystalline structures in a post-treatment, which enables further hue adjustment.

The invention claimed is:

1. A compound semiconductor light-emitting element, comprising:
    a substrate;
    a first electrode provided on a first face of the substrate;
    a plurality of nanoscale columnar crystalline structures in which an n-type semiconductor layer, a light-emitting layer and a p-type semiconductor layer are stacked in a predetermined order on a second face of the substrate;
    a second electrode connected to top portions of the plurality of nanoscale columnar crystalline structures; and
    a foundation layer, provided on a side of the second face, in a first region that is a partial region of the substrate, the foundation layer controlling a growth of the nanoscale columnar crystalline structures, wherein a level difference is provided, on the second face, between the first region and a second region that is at least part of a remaining region of the substrate excluding the first region.

2. The compound semiconductor light-emitting element according to claim 1, wherein
a second foundation layer is formed on the second face in the second region and has conditions different from conditions of the foundation layer in the first region.

3. The compound semiconductor light-emitting element according to claim 2, wherein
the foundation layer in the first region and the second foundation layer in the second region differ from each other in at least one condition from among a layer thickness and a material.

4. The compound semiconductor light-emitting element according to claim 2, wherein
the foundation layer in the first region and the second foundation layer in the second region are divided into a plurality of islands, and
a first size of the plurality of islands that make up the foundation layer in the first region and a second size of the plurality of islands that make up the second foundation layer in the second region differ.

5. The compound semiconductor light-emitting element according to claim 1, wherein
a ratio of a length to a thickness of the nanoscale columnar crystalline structures provided in the first region and the second region is set in such a manner that wavelengths of a maximum intensity in a spectrum of light emitted by the nanoscale columnar crystalline structures provided in the first region and the second region are wavelengths of colors positioned at both ends of a straight line that intersects a white region in a Commission International de l'Eclairage (CIE) chromaticity diagram.

6. The compound semiconductor light-emitting element according to claim 1, wherein
a third region is provided in the substrate, the third region being at least part of a remaining region of the substrate excluding the first region and the second region, the third region having a level difference with respect to the first region and the second region, in the second face of the substrate,
a third foundation layer for controlling a growth of the nanoscale columnar crystalline structures is formed on the second face in the third region, and wherein
a ratio of a length to a thickness of the nanoscale columnar crystalline structures provided in the first region, the second region and the third region is set in such a manner that wavelengths of a maximum intensity in a spectrum of light emitted by the nanoscale columnar crystalline structures provided in the first region, the second region and the third region are wavelengths of colors positioned at vertices of a triangle that encloses a white region in a Commission International de l'Eclairage (CIE) chromaticity diagram.

7. The compound semiconductor light-emitting element according to claim 1, wherein the foundation layer comprises a compound seed crystal film.

8. The compound semiconductor light-emitting element according to claim 1, wherein the foundation layer comprises a catalyst material film.

9. The compound semiconductor light-emitting element according to claim 1, wherein
the first region is provided as a plurality of strips spaced apart from each other;
a region that constitutes the spacing of each of the plurality of strips is used as the second region, and wherein
the first electrode comprises:
a first region electrode for supplying a first voltage to the plurality of strips, and
a second region electrode, spaced apart from the first region electrode, for supplying a second voltage to the second region.

10. The compound semiconductor light-emitting element according to claim 9, wherein
the first region electrode comprises a comb shape on the first face of the substrate, and is arrayed and connected in such a manner that prongs of a comb in the comb shape run along a strip-like first region, and
the second region electrode comprises a comb shape on the first face of the substrate, and is connected at the second region by being disposed opposing the first region electrode in such a manner that a first prone of a first comb meshes with a second prone of a second comb.

11. The compound semiconductor light-emitting element according to claim 1, wherein an insulating region is provided at a boundary between the first region and the second region.

12. An illumination device using the compound semiconductor light-emitting element according to claim 1.

13. A method for manufacturing a compound semiconductor light-emitting element, comprising:
forming a first electrode on a first face of a substrate;
forming a recess in the substrate, on a first side of a second face, in a first region being a partial region of the substrate, to form a level difference between the first region and a second region being at least part of a remaining region of the substrate excluding the first region;
forming a foundation layer, for controlling a growth of nanoscale columnar crystalline structures, on a bottom of the recess;
growing, on the bottom of the recess and in the second region on the second face, a plurality of the nanoscale columnar crystalline structures by stacking, in a predetermined order, an n-type semiconductor layer, a light-emitting layer and a p-type semiconductor layer, up to substantially a same height over the bottom of the recess and over the second face in the second region; and
forming a second electrode connected to top portions of the plurality of the nanoscale columnar crystalline structures.

14. The method for manufacturing a compound semiconductor light-emitting element according to claim 13, further comprising:
forming a mask such that an outer periphery of the bottom of the recess is open;
forming an insulating layer through an ion implantation into the first region, through the open in the recess; and
removing the mask.

15. The method for manufacturing a compound semiconductor light-emitting element according to claim 13, further comprising:
performing a post-treatment, after growing the plurality of the nanoscale columnar crystalline structures, to selectively narrow an effective diameter of the plurality of the nanoscale columnar crystalline structures.

16. The method for manufacturing a compound semiconductor light-emitting element according to claim 14, wherein forming a mask such that an outer periphery of the bottom of the recess is open comprises forming the mask after forming the recess.

* * * * *